United States Patent
Hayakawa et al.

(10) Patent No.: US 9,944,515 B2
(45) Date of Patent: Apr. 17, 2018

(54) MANUFACTURING METHOD OF SEMICONDUCTOR DEVICE

(71) Applicant: DENSO CORPORATION, Kariya, Aichi-pref. (JP)

(72) Inventors: Yutaka Hayakawa, Kariya (JP); Hisanori Yokura, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/528,124

(22) PCT Filed: Feb. 3, 2016

(86) PCT No.: PCT/JP2016/000553
§ 371 (c)(1),
(2) Date: May 19, 2017

(87) PCT Pub. No.: WO2016/132694
PCT Pub. Date: Aug. 25, 2016

(65) Prior Publication Data
US 2017/0305742 A1  Oct. 26, 2017

(30) Foreign Application Priority Data

Feb. 16, 2015  (JP) ................................. 2015-027738
Dec. 11, 2015  (JP) ................................. 2015-242400

(51) Int. Cl.
*B81C 1/00*  (2006.01)
*G01L 9/00*  (2006.01)
(Continued)

(52) U.S. Cl.
CPC ........ *B81C 1/00357* (2013.01); *G01L 9/0042* (2013.01); *G01L 9/0051* (2013.01);
(Continued)

(58) Field of Classification Search
CPC ......... B81C 1/00; B81C 1/00357; G01L 9/00; G01L 9/0042; G01L 9/0051;
(Continued)

(56) References Cited

U.S. PATENT DOCUMENTS

2006/0280661 A1* 12/2006 Kim ..................... B01J 19/0093
422/198
2009/0152656 A1   6/2009 Okudo et al.
(Continued)

FOREIGN PATENT DOCUMENTS

| JP | 2000-124469 A | 4/2000 |
| JP | 2012-187664 A | 10/2012 |
| JP | 2016-008935 A | 1/2016 |

*Primary Examiner* — Thanh T Nguyen
(74) *Attorney, Agent, or Firm* — Posz Law Group, PLC (57) ABSTRACT

A manufacturing method of a semiconductor device, in which a vacuum-pressure airtight chamber is defined by a space between a first substrate and a recessed portion of a second substrate, includes preparing the first substrate and the second substrate both of which contain silicon, joining the two substrates together, performing a heat treatment to emit hydrogen gas from the airtight chamber, and generating OH groups on the substrates before the joining. In the joining of the substrates together, the OH groups are bonded together to generate covalent bonds, and in the heat treatment, a part on which the OH groups are generated is heated at a temperature rise rate of 1° C./sec or smaller until a temperature of the substrate increases to 700° C. or higher, and a heating temperature and heating time are adjusted to emit hydrogen gas from the airtight chamber.

2 Claims, 6 Drawing Sheets

(51) Int. Cl.
*H01L 21/18* (2006.01)
*H01L 21/20* (2006.01)

(52) U.S. Cl.
CPC ............. *B81B 2201/0264* (2013.01); *B81B 2203/0127* (2013.01); *H01L 21/187* (2013.01); *H01L 21/2007* (2013.01)

(58) Field of Classification Search
CPC .... B81B 2201/0264; B81B 2203/0127; H01L 29/84; H01L 21/2007; H01L 21/187; H01L 21/76251; H01L 33/0079; H01L 21/764
See application file for complete search history.

(56) References Cited

U.S. PATENT DOCUMENTS

| | | |
|---|---|---|
| 2009/0159997 A1 | 6/2009 | Okudo et al. |
| 2009/0236678 A1 | 9/2009 | Okudo et al. |
| 2009/0267165 A1 | 10/2009 | Okudo et al. |
| 2010/0148293 A1* | 6/2010 | Jain ............... A61B 5/0017 257/434 |
| 2011/0027930 A1* | 2/2011 | El-Gamal ......... B81C 1/00301 438/51 |
| 2011/0133295 A1* | 6/2011 | Fujii ................ G01P 15/0802 257/415 |
| 2011/0270341 A1* | 11/2011 | Ruben .............. H01L 23/564 607/9 |
| 2015/0048523 A1* | 2/2015 | Suga ................ H01L 24/74 257/777 |

* cited by examiner

MANUFACTURING METHOD OF SEMICONDUCTOR DEVICE

CROSS REFERENCE TO RELATED APPLICATIONS

This application is a U.S. national stage application of International Patent Application No. PCT/JP2016/000553 filed on Feb. 3, 2016 and is based on Japanese Patent Application No. 2015-27738 filed on Feb. 16, 2015 and Japanese Patent Application No. 2015-242400 filed on Dec. 11, 2015, the disclosures of which are incorporated herein by reference.

TECHNICAL FIELD

The present disclosure relates to a manufacturing method of a semiconductor device in which a first substrate and a second substrate are joined together to configure an airtight chamber between the first substrate and the second substrate.

BACKGROUND ART

Conventionally, a semiconductor device having an airtight chamber between a first substrate and a second substrate described below has been proposed (see, e.g., Patent Literature 1). In this semiconductor device, a sensing portion which detects an angle velocity is formed on the first substrate. In the second substrate, a recessed portion is formed on one surface facing the sensing portion formed on one surface of the first substrate. The second substrate is joined to the first substrate to provide the airtight chamber which seals the sensing portion in a room defined by a space between the first substrate and the recessed portion. The airtight chamber is under a vacuum pressure.

The manufacturing method of the above-described semiconductor device is described below. First, the sensing portion detecting the angle velocity is provided to the first substrate, and the recessed portion is formed in the second substrate. Subsequently, the first substrate and the second substrate are joined together to configure the airtight chamber which seals the sensing portion in the room defined by the space between the first substrate and the recessed portion.

In a joining of the first substrate and the second substrate, it is known that OH groups are formed on respective joining surfaces of the first substrate and the second substrate, and a strength of joining can be enhanced by a covalent bond of OH groups formed on respective joining surfaces. Though the above-described method using chemical bond can enhance the strength of joining between the first substrate and the second substrate, there is a difficulty that a pressure in the airtight chamber becomes higher than an intended pressure due to hydrogen gas (that is, degassing) which is generated in the airtight chamber from the OH groups.

In view of the foregoing difficulties, it is considered that a diffusion length (that is, diffusion coefficient) of the hydrogen gas in the airtight chamber may be increased by a heat treatment so that the hydrogen gas is diffused into (that is, passed through) the first substrate or the second substrate and emitted to an outside. When the heat treatment is not performed adequately, the pressure in the airtight chamber may fail to reach an intended pressure. That is, the pressure in the airtight chamber may be fluctuated.

The above-described difficulty does not arise only in the airtight chamber sealing the sensing portion. A similar difficulty also arises, for example, in a pressure sensor or the like having the airtight chamber as a reference pressure chamber when the airtight chamber is provided by joining the first substrate and the second substrate together.

PATENT LITERATURE

Patent Literature 1: JP 2012-187664 A

SUMMARY

In view of the foregoing difficulties, it is an object of the present disclosure to provide a manufacturing method of a semiconductor device which is capable of restricting a fluctuation of a pressure in an airtight chamber.

According to an aspect of the present disclosure, a manufacturing method of a semiconductor device is provided. The semiconductor device includes a first substrate having one surface and a second substrate having one surface, another surface and a recessed portion. The one surface of the second substrate is joined to the first substrate to face the one surface of the first substrate. Another surface of the second substrate is opposite to the one surface of the second substrate. The recessed portion of the second substrate is arranged on the one surface of the second substrate. An airtight chamber having a vacuum pressure is defined by a space between the first substrate and the recessed portion of the second substrate. The manufacturing method of the semiconductor device includes preparing the first substrate that contains silicon, preparing the second substrate that contains silicon and has the one surface on which the recessed portion is arranged, joining the one surface of the first substrate and the one surface of the second substrate together to define the airtight chamber, performing a heat treatment to emit hydrogen gas from the airtight chamber, and generating OH groups on the one surface of the first substrate and on the one surface of the second substrate before joining the one surface of the first substrate and the one surface of the second substrate together, the one surface of the second substrate including a wall surface of the recessed portion. In the joining of the one surface of the first substrate and the one surface of the second substrate together, the OH groups generated on the first substrate and the OH groups generated on the second substrate are bonded together to generate covalent bonds. In the heat treatment, the first substrate and the second substrate are heated at a temperature rise rate of 1° C./sec until a temperature of a part of the first substrate on which the OH groups are generated increases to 700° C. or higher and a part of the second substrate on which the OH groups are generated increases to 700° C. or higher, and the hydrogen gas is generated by the heat treatment. In the heat treatment, the hydrogen gas that is generated is emitted from the airtight chamber by setting a diffusion length of the hydrogen gas to be equal to or longer than a shortest distance between the wall surface of the airtight chamber and a wall surface of the semiconductor device which is exposed to the atmosphere, and a heating temperature and a heating time are adjusted in the setting of the diffusion length of the hydrogen gas.

In the above-described manufacturing method of the semiconductor device, after generating the OH groups on the first substrate and the second substrate and joining the first substrate and the second substrate together, a wall surface providing the airtight chamber to a temperature of 700° C. or higher at the temperature rise rate of 1° C./sec or less. With this process, the OH groups left in the airtight chamber are capable of completely converting into the hydrogen gas. The heating temperature and the heating time are adjusted to set the diffusion distance to be equal to or longer than the distance between the bottom surface of the recessed portion and another surface of the second substrate. With this configuration, the hydrogen gas in the airtight chamber is capable of being emitted. With this configuration, the pressure in the airtight chamber 30 is capable of reaching the intended pressure and this can restrict a fluctuation of the pressure in the airtight chamber.

In the heat treatment, the OH groups left in the airtight chamber 30 are completely converted into the hydrogen gas. Thus, in the airtight chamber 30, the generation of the hydrogen gas can be restricted and the fluctuation in the pressure caused by the hydrogen gas can be restricted when the semiconductor device is in use.

BRIEF DESCRIPTION OF DRAWINGS

The above and other objects, features and advantages of the present invention will become more apparent from the following detailed description made with reference to the accompanying drawings. In the drawings.

DETAILED DESCRIPTION

First Embodiment

The following will describe a first embodiment of the present disclosure with reference to the drawings. The present embodiment will describe an example in which a manufacturing method of a semiconductor device according to the present disclosure is applied to a manufacturing method of a pressure sensor. The following will describe a pressure sensor manufactured by the manufacturing method according to the present embodiment.

Figure 1:
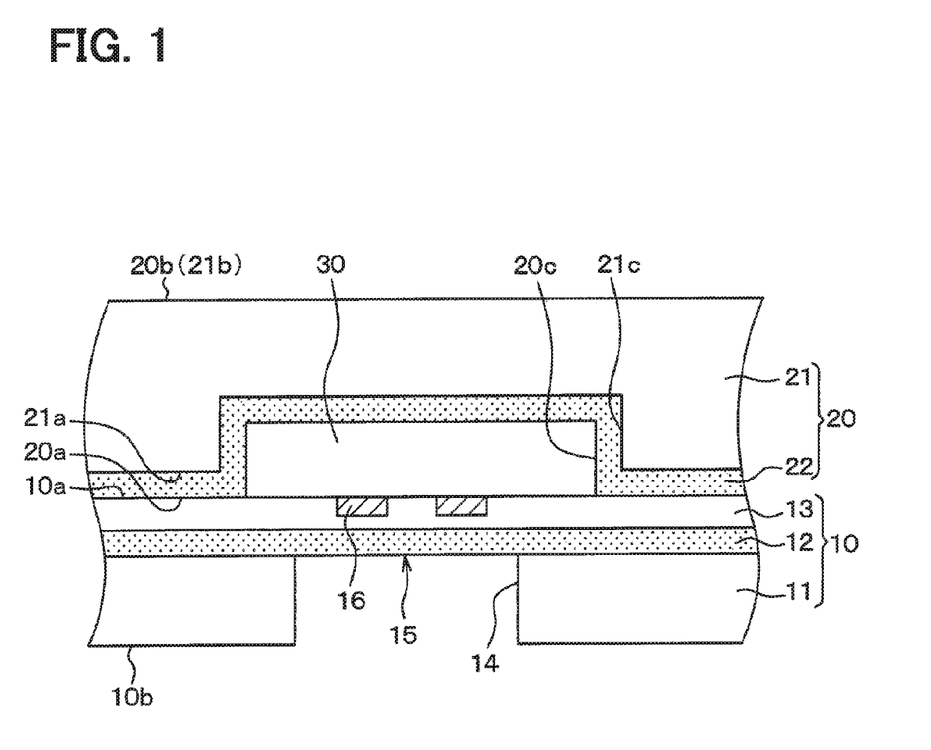
FIG. 1 is a diagram showing a cross-sectional view of a pressure sensor in a first embodiment of the present disclosure.

As shown in FIG. 1, the pressure sensor in the present embodiment includes a first substrate 10, and the first substrate 10 has one surface 10a and another surface 10b. In the present embodiment, the first substrate 10 is configured by an SOI (Silicon on Insulator) in which a supporting substrate 11, an insulating film 12, and a semiconductor layer 13 are stacked in described order. Thus, the one surface 10a of the first substrate 10 is provided by one surface of the semiconductor layer 13, which is arranged opposite to the insulating film 12. Another surface 10b of the first substrate 10 is provided by one surface of the supporting substrate 11, which is arranged opposite to the insulating film 12. In the present embodiment, the supporting substrate 11 and the semiconductor layer 13 are made of silicon substrates or the like, and the insulating film 12 is made of $SiO_2$, SiN, or the like.

In the first substrate 10, a formation of a depressed portion 14 on another surface 10b defines a diaphragm portion 15. In the present embodiment, the depressed portion 14 is defined from another surface 10b of the first substrate 10 to reach the insulating film 12. Therefore, the diaphragm portion 15 is provided by the insulating film 12 and the semiconductor layer 13 which are disposed between a bottom surface of the depressed portion 14 and the one surface 10a of the first substrate 10.

In the diaphragm portion 15, four gauge resistors 16 (in FIG. 1, only two are shown) are disposed, and each gauge resistor 16 is appropriately connected via a connection wiring layer to form a bridge circuit. The connection wiring layer is not shown in the figure. In the present embodiment, the gauge resistors 16 provide a diffusion layer which is generated by ion implantation of impurity and performing of a heat treatment after the ion implantation of the impurity. In the present embodiment, a surface concentration of the impurity which configures the gauge resistors 16 is defined within a range from $1.0 \times 10^{-18}$ to $1.0 \times 10^{-21}$ cm$^{-3}$, and the gauge resistor 16 corresponds to the diffusion layer in the present disclosure. Although it is not shown in the drawings, a pullout wiring layer or the like is also formed in the first substrate 10, and the pullout wiring layer is appropriately connected to each gauge resistor 16, and is also connected to an external circuit via a unshown through electrode formed on the second substrate 20.

The second substrate 20 is disposed on the one surface 10a of the first substrate 10. In the present embodiment, the second substrate 20 has a stack substrate 21 and an insulating film 22, and the insulating film 22 is formed on one surface 21a of the stack substrate 21 which faces the first substrate 10. The one surface 20a of the insulating film 22 is arranged opposite to the stack substrate 21 with respect to the insulating film 22. The stack substrate 21 is made of silicon substrate or the like, and the insulating film 22 is made of $SiO_2$, SiN or the like. Another surface 20b of the second substrate 20 is provided by another surface 21b of the stack substrate 21 which is opposite to the one surface 21a.

A depressed portion 21c is formed on the one surface 21a of the stack substrate 21 at a position to face the gauge resistors 16, and the insulating film 22 is also formed on a wall surface of the depressed portion 21c. In the second substrate 20, a recessed portion 20c is provided by a part of the insulating film 22 which is disposed on the wall surface of the depressed portion 21c, and the recessed portion 20c faces the gauge resistors 16. It is not specifically limited, but as an example, it is defined that a plane shape of the recessed portion 20c is a regular octagon and a length of a diagonal line passing a center of the recessed portion 20c is set to 350 μm. The recessed portion 20c is configured such that a distance between a bottom surface of the recessed portion 20c and another surface 20b of the second substrate 20 is within a range of 10 μm to 200 μm.

The one surface 20a (that is, the insulating film 22) of the second substrate 20 is joined to the one surface 10a (that is, the semiconductor layer 13) of the first substrate 10. With this configuration, an airtight chamber 30 is formed between the first substrate 10 and the second substrate 20 by the recessed portion 20c, and the airtight chamber 30 seals the gauge resistors 16. In the present embodiment, the intended pressure is applied from the airtight chamber 30 to the one surface 10a of the diaphragm portion 15, and thus, the airtight chamber 30 functions as a reference pressure chamber.

In the present embodiment, as will be described below, the first substrate 10 and the second substrate 20 are joined together by activating both joining surfaces of the first substrate 10 and the second substrate 20, which is known as a direct joining. Although it is not shown in the figure, a through hole is formed in the second substrate 20 to expose the pullout wiring layer formed on the first substrate 10, and the through hole penetrates along a stacking direction of the first substrate 10 and the second substrate 20. In the through hole, the through electrode is formed to electrically connect to the pullout wiring layer and to provide an electrical connection with the external circuit.

The above description is about the configuration of the pressure sensor according to the present embodiment. The following will describe a manufacturing method of the pressure sensor with reference to FIG. 2A to FIG. 2D.

Figure 2A:
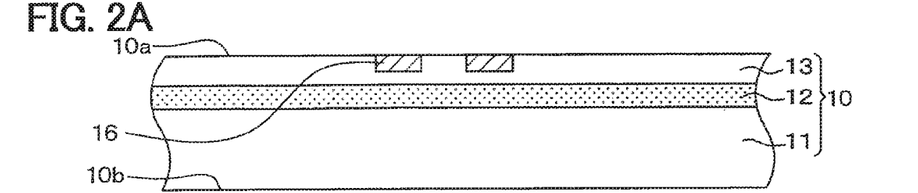
FIG. 2A to FIG. 2D are diagrams showing cross-sectional views of a manufacturing process of a pressure sensor.

First, as shown in FIG. 2A, the first substrate 10 in which the supporting substrate 11, the insulating film 12, and the semiconductor layer 13 are stacked in described order is prepared. A mask not shown in the figure is formed on the one surface 10a, and then ion implantation of the impurity and thermal diffusion of the impurity by a heat treatment are carried out to configure the gauge resistors 16, the connection wiring layer not shown in the figure, the pullout wiring layer, or the like. The connection wiring layer and the pullout wiring layer are not shown in the figure. In the heat treatment of this process, for example, the heating temperature of the first substrate 10 is set to within a range of 800° C. to 1100° C. so as to thermally diffuse the impurity.

Figure 2B:
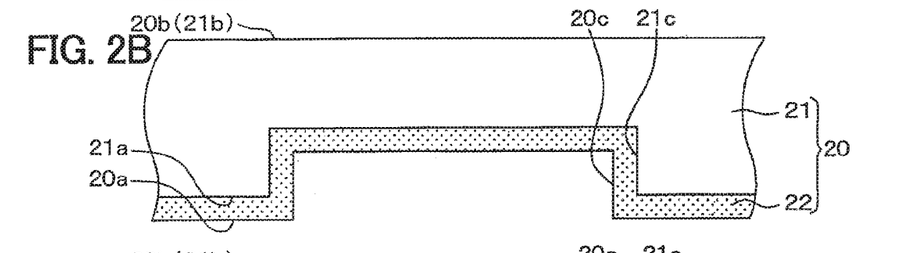

In another process different from the above described FIG. 2A, as shown in FIG. 2B, the stack substrate 21 is prepared, and the depressed portion 21c is formed on the one surface 21a of the stack substrate 21 by dry etching or the like. The insulating film 22 is formed on the one surface 21a of the stack substrate 21 by a chemical vapor deposition (that is, CVD) method or the like. With this process, the second substrate 20 is prepared and the recessed portion 20c defined by the insulating film 22 is formed on the second substrate 20.

Figure 2C:
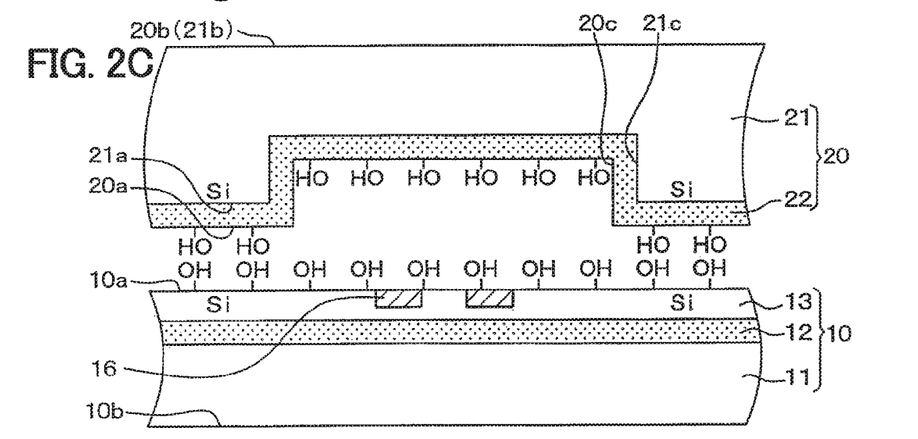

Subsequently, the first substrate 10 (the semiconductor layer 13) and the second substrate 20 (the insulating film 22) are joined together under a vacuum pressure. In the present embodiment, as shown in FIG. 2C, OH groups are generated on the one surface 10a of the first substrate 10 and on the one surface 20a of the second substrate 20.

Specifically, the first substrate 10 and the second substrate 20 are disposed in a chamber, which is not shown in the figure. Then, oxygen plasma, nitrogen plasma, an argon ion beam or the like is applied to the one surface 10a (that is, the semiconductor layer 13) of the first substrate 10 and the one surface 20a (that is, the insulating film 22) of the second substrate 20. By this process, the impurity which adheres on each joining surface is removed, and each joining surface is activated.

An activation of the joining surface indicates a condition that an atomic bond of an atom exposed on the joining surface loses a bonding partner. When activating the joining surface, oxygen plasma or the like is applied to the one surface 10a of the first substrate 10 and the one surface 20a of the second substrate 20. Thus, a region disposed on inner side relative to a portion of the one surface 10a of the first substrate 10 which joins to the second substrate 20 and a wall surface of the recessed portion 20c of the second substrate 20 are also activated.

For example, the first substrate 10 and the second substrate 20 are taken out from the chamber and exposed to atmosphere to generate the OH groups on the one surface 10a of the first substrate 10 and on the one surface 20a of the second substrate 20.

The OH groups are generated in the activated regions of the first substrate 10 and the second substrate 20. Thus, the OH groups are generated in the region disposed on inner side relative to the portion of the one surface 10a of the first substrate 10 which joins to the second substrate 20, and are generated on the wall surface of the recessed portion 20c of the second substrate 20 or the like. When generating the OH groups on the one surface 10a of the first substrate 10 and on the one surface 20a of the second substrate 20, OH groups may be generated on the first substrate 10 and the second substrate 20 by introducing the atmosphere into the chamber instead of taking out the first substrate 10 and the second substrate 20 from the chamber.

Figure 2D:
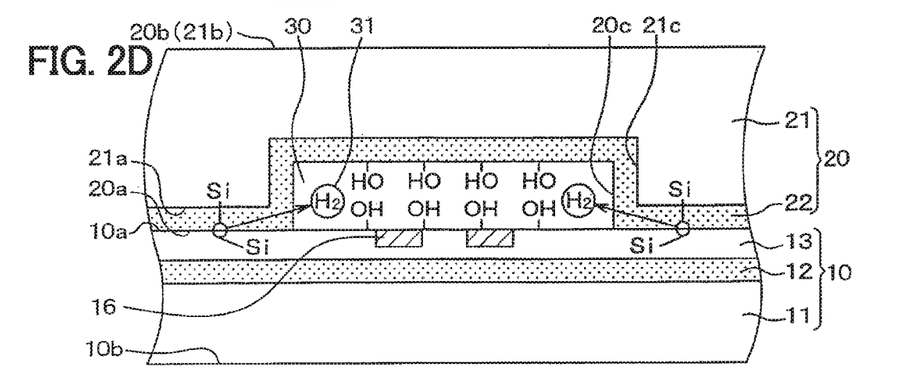

As shown in FIG. 2D, an alignment is performed using an infrared microscope or the like with reference to alignment marks marked on the first substrate 10 and the second substrate 20, and the first substrate 10 and the second substrate 20 are joined together by a method which is known as direct joining. In direct joining, objects are joined together at a low temperature within a range of room temperature to 550° C. In the present embodiment, during a direct joining of the first substrate 10 and the second substrate 20, the temperature is maintained at 300° C. and a weight of 18 kN is applied in the stacking direction of the first substrate 10 and the second substrate 20. With this process, the airtight chamber 30 is configured by a space between the first substrate 10 and the recessed portion 20c of the second substrate 20, and the airtight chamber 30 seals the gauge resistors 16.

In the above process, as shown by a reaction equation [F1] below, hydrogen gas 31 is generated when OH groups generated on the one surface 10a of the first substrate 10 and the one surface 20a of the second substrate 20 bond together to generate a covalent bond.

$$2SiOH \rightarrow SiOSi + H_2 + O^- \quad [F1]$$

After an end of the process of FIG. 2D, the hydrogen gas 31 is generated in the airtight chamber 30, and a pressure in the airtight chamber 30 becomes higher than the intended pressure.

Figure 3A:
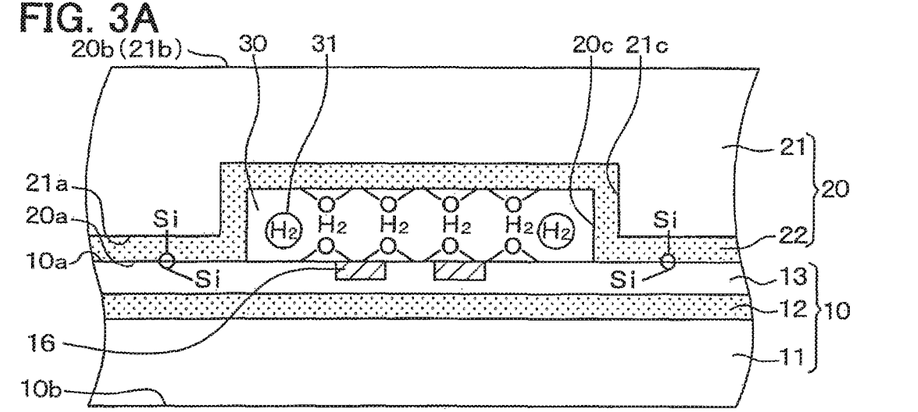
FIG. 3A to FIG. 3C are diagrams showing cross-sectional views of the manufacturing process of the pressure sensor which are the continuation of FIG. 2D.

As shown in FIG. 3A, after a process of FIG. 2D, the heat treatment is conducted by using an annealing apparatus, which is not shown in the figure. With this heat treatment, the OH groups not contributing the joining between the first substrate 10 and the second substrate 20, that is, the OH groups generated in the region disposed on inner side relative to the portion of the one surface 10a of the first substrate 10 which joins to the second substrate 20, and the OH groups generated on the wall surface of the recessed portion 20c of the substrate 20 are combined together, and water molecules are generated.

Figure 3B:
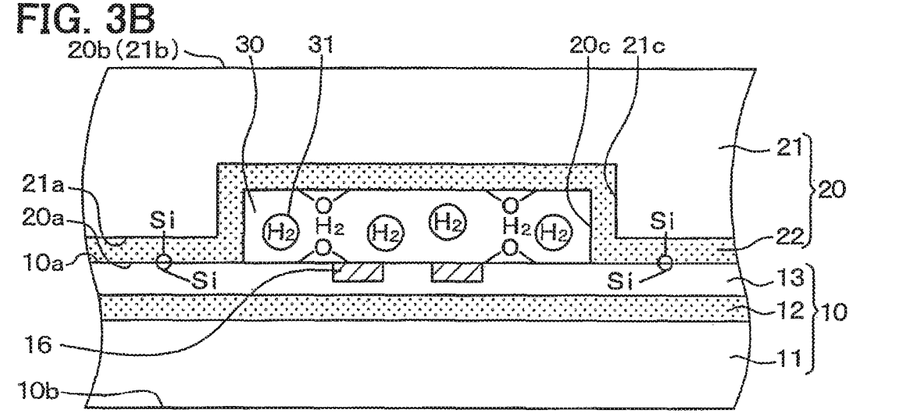

As shown in FIG. 3B, when the heat treatment is continuously carried out, water molecules react with silicon as a reaction equation [F2] shown below. As a result, an oxide film is generated (that is, getting thicker) and an amount of the generated hydrogen gas 31 is increased in the airtight chamber 30.

$$2H_2O + Si \rightarrow SiO_2 + 2H_2 \quad [F2]$$

Figure 4:
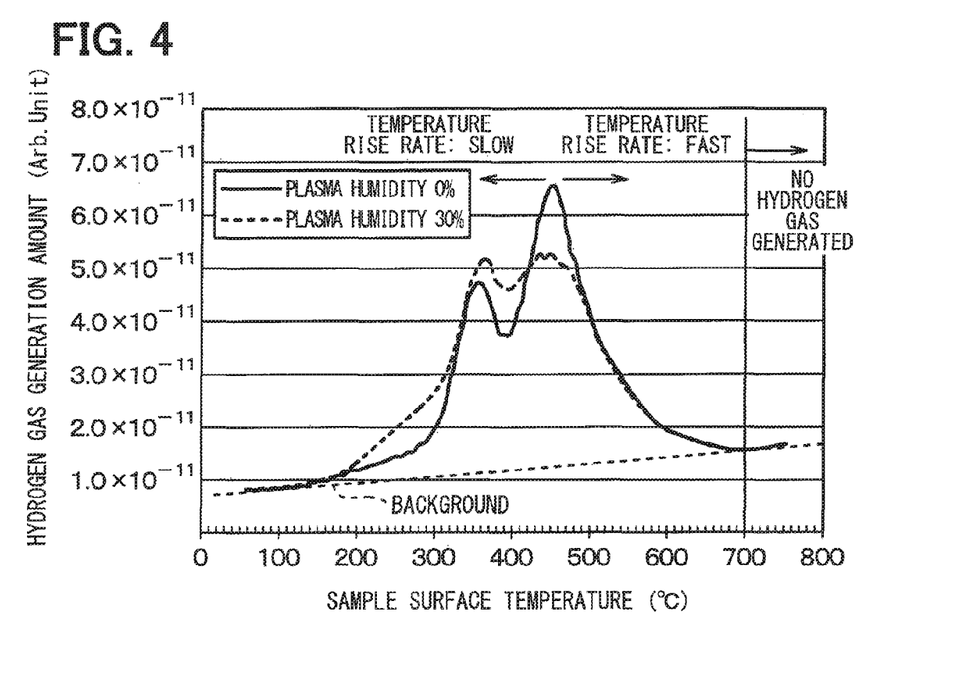
FIG. 4 is a graph showing a relationship between a generation amount of hydrogen gas and a temperature of a sample surface.

The inventors of the present disclosure performed an experiment about an amount of the hydrogen gas 31 generated from the OH groups when the OH groups are generated on the silicon substrate and the silicon substrate is heated, and got a result shown in FIG. 4 from the experiment. FIG. 4 shows the result of the experiment obtained by a thermal desorption spectrometry (that is, TDS) method after generating the OH groups by irradiating oxygen plasma, and a temperature rise rate is set to 1° C./sec in FIG. 4. A sample surface temperature shown in FIG. 4 indicates a temperature of a surface on which the OH groups are generated, and a broken line in FIG. 4 labeled as background indicates a specific noise of a device used in the experiment.

As shown in FIG. 4, when the OH groups are generated on the silicon substrate, the hydrogen gas can be generated by heating the silicon substrate and raising the sample surface temperature. The inventors of the present disclosure found that the hydrogen gas will not be generated when the sample surface temperature increases to 700° C. or higher in a case where the temperature rise rate is set to 1° C./sec. A certain principle is not obvious, but it is known that when the temperature rise rate is smaller than 1° C./sec, a maximum generation amount of hydrogen gas occurs on a low temperature side, and when the temperature rise rate is greater than 1° C./sec, the maximum generation amount of hydrogen gas occurs on a high temperature side. That is, when the temperature rise rate is smaller than 1° C./sec, a temperature at which the hydrogen gas is not generated moves to the low temperature side, and when the temperature rise rate is greater than 1° C./sec, a temperature at which the hydrogen gas is not generated moves to the high temperature side. In addition, as shown in FIG. 4, the inventors of the present disclosure found that when a plasma humidity is changed, the maximum generation amount of hydrogen gas and a temperature at which the maximum amount is generated will change, but a temperature at which the hydrogen gas is not generated maintains the same.

With consideration of the above experiment result, in the present embodiment, the heat treatment is carried out so that the temperature rise rate is equal to or greater than 1° C./sec and a temperature of the surface on which the OH groups are generated is equal to or higher than 700° C. That is, the heat treatment is carried out so that the temperatures of the one surface 10a of the first substrate 10, the one surface 20a of the second surface, and the wall surface of the recessed portion 20c increase to be equal to or higher than 700° C. With this process, all of the OH groups generated in the process of FIG. 2C are capable of being converted into the hydrogen gas 31.

Figure 3C:
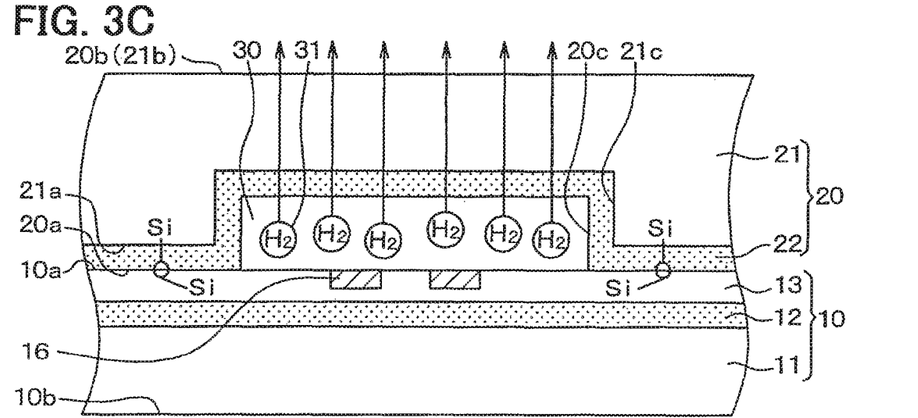

FIG. 3B shows a former state before the temperature of the surface on which the OH group is generated as shown in FIG. 3C increases to 700° C. or higher. In the process shown in FIG. 2D, the OH group generated on each joining surface of the first substrate 10 and the second substrate 20 react as the reaction equation [F1], but a partial OH group may remain. Thus, by heating the joining surfaces of the first substrate 10 and the second substrate 20 to 700° C. or higher, even when the OH group which did not react in the process of FIG. 2D remains, the OH group is capable of being converted into the hydrogen gas 31.

As shown in FIG. 3C, the heating temperature (that is, the temperature which is equal to or higher than 700° C.) is maintained, and degassing process which emits the hydrogen gas 31 generated in the airtight chamber 30 from inside of the airtight chamber 30 to outside of the airtight chamber 30 is performed.

The following will describe the degassing process in detail. It is publicly known that a diffusion length of the hydrogen gas 31 is proportional to a diffusion coefficient (D) and a heating time (t) (that is, 2 $(Dt)^{1/2}$), and the diffusion coefficient (D) is also proportional to a heating temperature. That is, the diffusion length of the hydrogen gas 31 is proportional to the heating time and the heating temperature.

Figure 5:
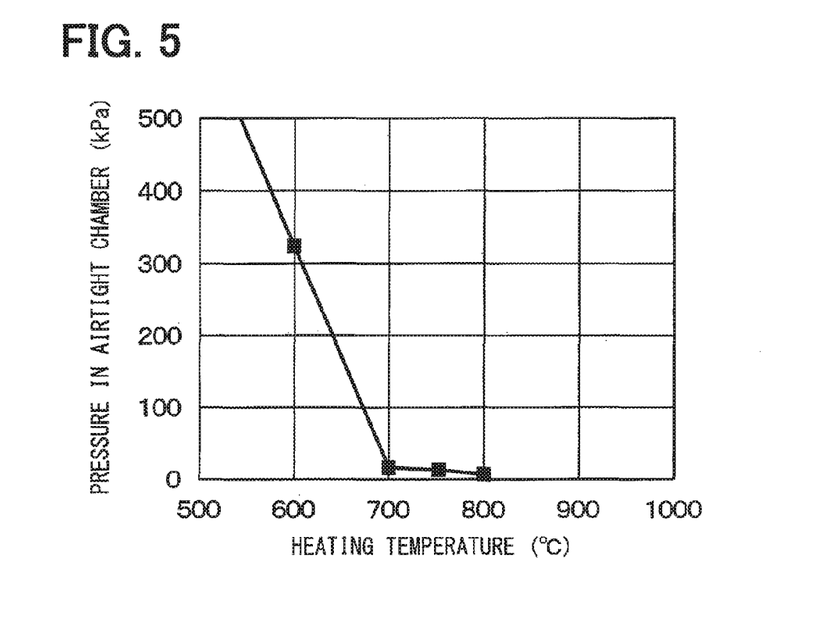
FIG. 5 is a graph showing a relationship between a heating temperature and a pressure in an airtight chamber.

The hydrogen gas 31 is diffused (that is, passed) and emitted through a part which has a shortest distance between the wall surface configuring the airtight chamber 30 and a wall surface exposed to an outside air, and the diffusion distance of the hydrogen gas 31 is set to be equal to or longer than the shortest distance. The inventors of the present disclosure performed an experiment to maintain a constant diffusion distance by adjusting the heating temperature and the heating time, and got an experiment result shown in FIG. 5. In the present embodiment, the part having the shortest distance between the wall surface configuring the airtight chamber 30 and the wall surface exposed to the outside air is a part which is disposed between the bottom surface of the recessed portion 20c and another surface 20b of the second substrate 20. FIG. 5 shows a graph when the volume in the airtight chamber 30 is set to $1.0 \times 10^{-3}$ mm$^{-3}$, the distance between the bottom surface of the recessed portion 20c and another surface 20b of the second substrate 20 is defined within a range of 10 μm to 200 μm, and the temperature rise rate is set to 1° C./sec.

With the diffusion length set to be equal to or longer than the distance between the bottom surface of the recessed portion 20c and another surface 20b of the second substrate 20, the heating temperature (that is, the diffusion coefficient) and the heating time are adjusted to maintain the diffusion length, which is proportional to $D^{1/2}$ and $t^{1/2}$, to be constant. In the above case, as shown in FIG. 5, it is found that, for example, the heating temperature of 600° C. is not enough high for substantially decreasing the pressure in the airtight chamber 30. That is, it is found that when the heating temperature is set to 600° C., the hydrogen gas 31 in the airtight chamber 30 fails to be substantially emitted. As described above, D represents the diffusion coefficient, and t represents the heating time.

It is estimated that, at the heating temperature of 600° C., not all of the OH groups are converted into the hydrogen gas 31. Further, a small quantity of the hydrogen gas 31 is continually generated when the temperature is maintained at 600° C. In FIG. 5, under the heating temperature of 600° C., in order to set the diffusion length of the hydrogen gas 31 to be equal to or longer than the distance between the bottom surface of the recessed portion 20c and another surface 20b of the second substrate 20, the heating time needs to be increased to a substantially long time, i.e. 75 hours.

When the surface on which the OH groups are generated is heated to 700° C. or higher, as shown in FIG. 4, all of the OH groups generated in FIG. 2C are capable of being converted into the hydrogen gas 31. As a result, in the degassing process, by adjusting the heating temperature and the heating time such that the diffusion distance is equal to or longer than the distance between the bottom surface of the recessed portion 20c and another surface 20b of the second substrate 20, the hydrogen gas 31 generated in the airtight chamber 30 is capable of being emitted, and the pressure in the airtight chamber 30 is capable of reaching the intended pressure.

In the present embodiment, as described above, a part having the shortest distance between the wall surface configuring the airtight chamber 30 and the wall surface exposed to the outside air is the part between the bottom surface of the recessed portion 20c and another surface 20b of the second substrate 20. Thus, in an example shown in FIG. 3C, emission of the hydrogen gas 31 is carried out through the part between the bottom surface of the recessed portion 20c and another surface 20b of the second substrate 20. For example, when the shortest distance part between the wall surface configuring the airtight chamber 30 and the wall surface exposed to the outside air is provided by a part between the one surface 10a and another surface 10b of the first substrate 10, the hydrogen gas 31 is diffused and emitted through the part between the one surface 10a and another surface 10b of the first substrate 10.

A melting point of silicon is 1412° C. So, the heat treatment is preferable to be conducted at a temperature lower than 1412° C. The above process describes an example in which the surface on which the OH groups are generated is heated to be equal to or higher than 700° C. as shown in FIG. 3B, and the temperature is maintained as it is as shown in FIG. 3C. In the degassing process shown in FIG. 3C, the diffusion distance of the hydrogen gas 31 is proportional to the heating temperature and the heating time. Thus, for example, the surface on which the OH groups are generated is heated to be equal to or higher than 700° C. in the process shown in FIG. 3B, and the temperature is decreased to 600° C. in the process shown in FIG. 3C. That is, the diffusion distance can be set equal to or longer than the distance between the bottom surface of the recessed portion 20c and another surface 20b by increasing the heating time.

The following process is not shown in the drawings. In the following process, a mask is formed on another surface 10b of the first substrate 10, and the diaphragm portion 15 is provided by forming the depressed portion 14 using dry etching or the like. With the above-described process, the pressure sensor shown in FIG. 1 is manufactured.

In the foregoing description, an exemplary manufacturing method of the pressure sensor is described. Alternatively, the first substrate 10 and the second substrate 20 each may be provided by a wafer, and the above process may be performed to the wafers, and then, a dice-cutting is performed to the wafers in order to cut the wafers into unit chips.

As described above, in the present embodiment, the OH groups are generated on the one surface 10a of the first substrate 10 and on the one surface 20a of the second substrate 20, and the first substrate 10 and the second substrate 20 are joined together. The temperature rise rate is set to be equal to or less than 1° C./sec, and the surface on which the OH groups are generated is heated to be equal to or higher than 700° C. With this configuration, the OH groups generated to join the first substrate 10 with the second substrate 20 can be completely converted into the hydrogen gas 31 (see FIG. 4).

In the degassing process, the heating temperature and the heating time are adjusted to set the diffusion distance to be equal to or longer than the distance between the bottom surface of the recessed portion 20c and another surface 20b of the second substrate 20. With this configuration, the hydrogen gas 31 in the airtight chamber 30 is capable of being substantially emitted and the pressure in the airtight chamber 30 is capable of being substantially decreased (that is, a vacuum state). This can restrict a fluctuation in the pressure in the airtight chamber 30.

In the heat treatment, because the OH groups left in the airtight chamber 30 are completely converted into the hydrogen gas, in the airtight chamber 30, the generation of the hydrogen gas can be restricted and the fluctuation in the pressure caused by the hydrogen gas can be restricted when the semiconductor device is in use.

Second Embodiment

The second embodiment of the present disclosure will be described. The present embodiment is obtained by modifying the configuration of the first substrate 10 in the first embodiment. The present embodiment is similar to the first embodiment, and a description of the similar or same portion is omitted hereinafter for simplification.

Figure 6:
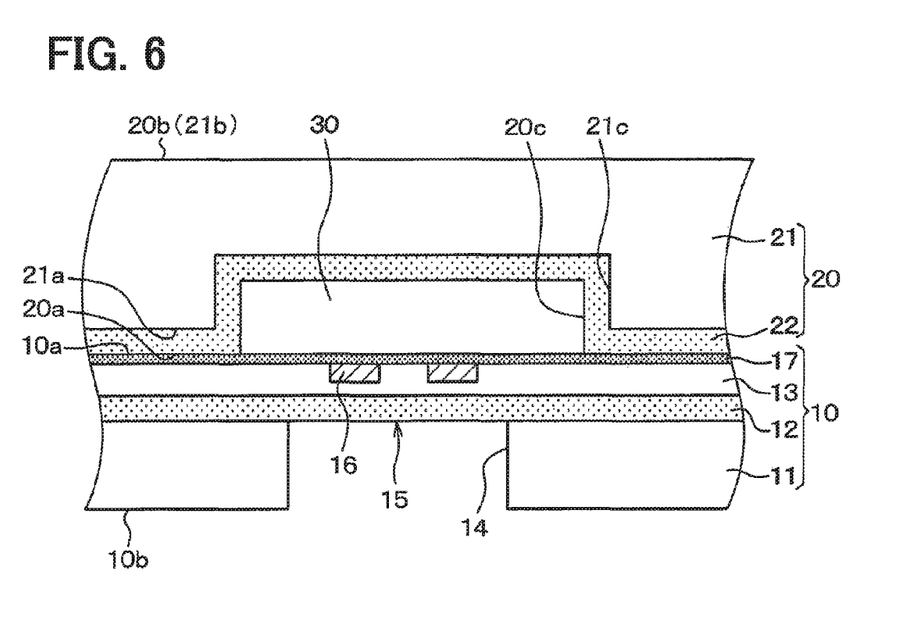
FIG. 6 is a diagram showing a cross-sectional view of a pressure sensor according to a second embodiment of the present disclosure.

As shown in FIG. 6, in the pressure sensor in the present embodiment, the first substrate 10 has a thin insulating film 17 on the semiconductor layer 13. That is, the first substrate 10 includes the supporting substrate 11, the insulating film 12, the semiconductor layer 13, and the thin insulating film 17 which are stacked in described order. The one surface 10a is provided by one surface of the thin insulating film 17, which is disposed on opposite side of the semiconductor layer 13. The diaphragm portion 15 is provided by partial insulating film 12, partial semiconductor layer 13, and partial thin insulating film 17 which are disposed between the bottom surface of the depressed portion 14 and the one surface 10a of the first substrate 10.

The above-described pressure sensor is manufactured as below. After the gauge resistors 16 or the like are formed in the process of FIG. 2A, the thin insulating film 17 is formed on the semiconductor layer 13 by, for example, thermal oxidation to configure the first substrate 10. Then, above-described processes after FIG. 2B are performed. In the heat treatment performed after the process of FIG. 3A, the heat treatment is performed under a condition that the thin insulating film 17 is formed on the semiconductor layer 13. With this method, the above-described pressure sensor is manufactured.

In the above manufacturing method, the degassing process is performed under a condition that the thin insulating film 17 is formed on the semiconductor layer 13. Thus, in the degassing process, the thin insulating film 17 can restrict out diffusion (out diffusion) in which the impurity configuring the gauge resistors 16 diffuse into the airtight chamber 30, and thereby restricting a fluctuation in property of the gauge resistors 16.

In a case where the thin insulating film 17 and the insulating film 22 are joined together by the direct joining indicated in the process of the above-described FIG. 2C, when the thin insulating film 17 is thick, a strength of the joining may be decreased. So, it is preferable to form the thin insulating film 17 to have a thickness of 10 nm or less.

Other Embodiments

The first and second embodiments described examples in which manufacturing methods of the semiconductor device according to the present disclosure are applied to the manufacturing method of the pressure sensor. The present disclosure may also be applied to the manufacturing methods of various types of semiconductor devices each of which has the airtight chamber 30 and a pressure in the airtight chamber 30 is set to vacuum state. The present disclosure may also be applied to a manufacturing method of an angular velocity sensor.

Figure 7:
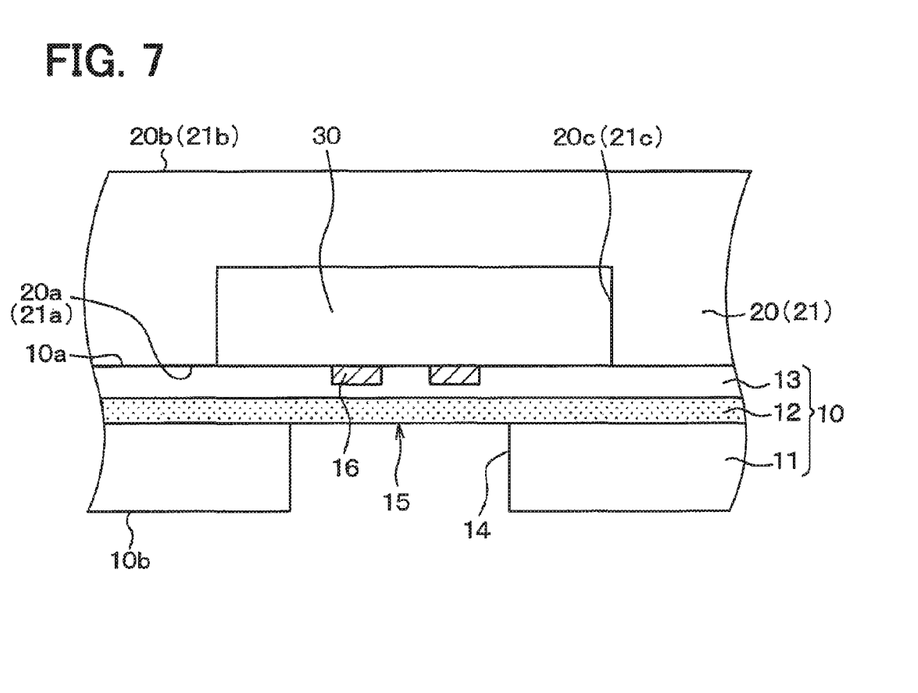
FIG. 7 a diagram showing a cross-sectional view of a pressure sensor according to another embodiment of the present disclosure.

As shown in FIG. 7, the present disclosure is capable of being applied to the manufacturing method of the pressure sensor in which the second substrate 20 is only composed of the stack substrate 21. In such a pressure sensor, the recessed portion 20c of the second substrate 20 is configured on the depressed portion 21c of the stack substrate 21, and a part located between the bottom surface of the recessed portion 20c and another surface 20b of the second substrate 20 is only the stack substrate 21. Although it is not shown in FIG. 1, the insulting film 22 formed on the wall of the depressed portion 21c may be omitted.

Figure 8:
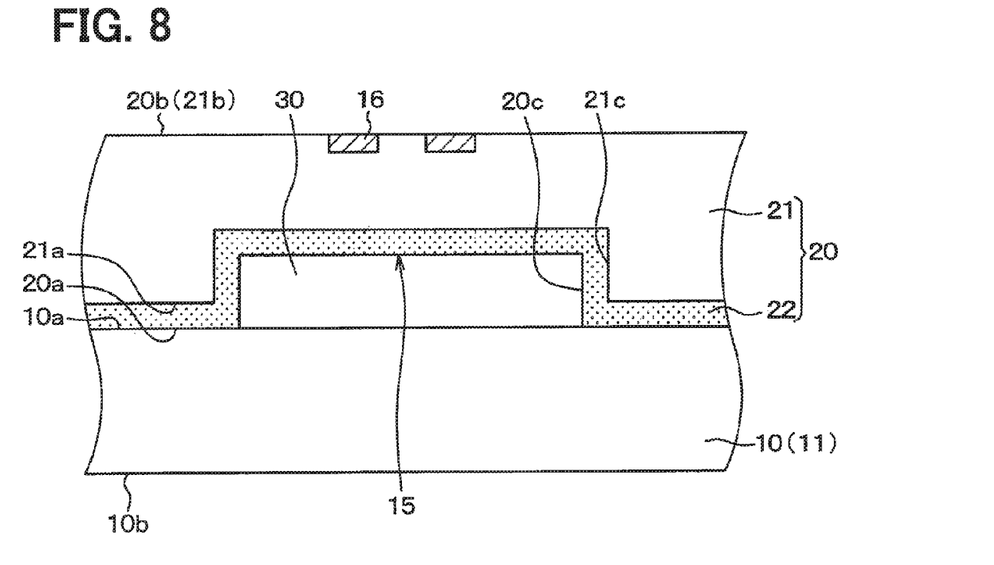
FIG. 8 is a diagram showing a cross-sectional view of a pressure sensor according to another embodiment of the present disclosure.
Figure 9:
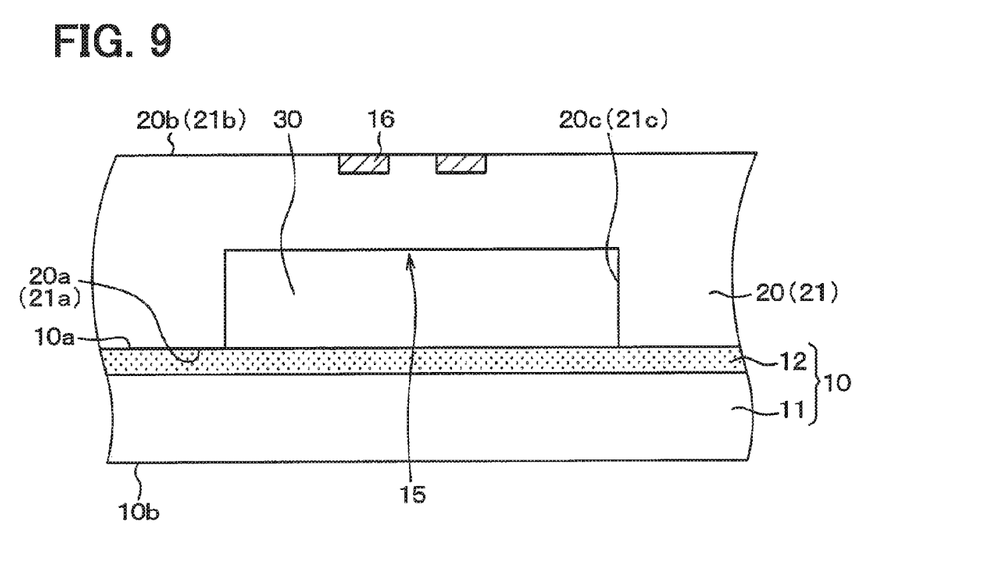
FIG. 9 is a diagram showing a cross-sectional view of a pressure sensor according to another embodiment of the present disclosure.

As shown in FIG. 8, the first substrate 10 may be configured only by the supporting substrate 11, and the diaphragm portion 15 may be defined by partial stack substrate 21 and partial insulating film 22, which are disposed between the bottom surface of the recessed portion 20c and another surface 20b of the second substrate 20. The present disclosure is capable of being applied to the manufacturing method of the pressure sensor in which the gauge resistors 16 are arranged on the diaphragm portion 15. Further, as shown in FIG. 9, as a modification of the configuration shown in FIG. 8, the present disclosure is capable of being applied to the manufacturing method of the pressure sensor which includes the first substrate 10 having the supporting substrate 11 and the insulating film 12, and the second substrate 20 only having the stack substrate 21. In such a pressure sensor which is similar to the pressure sensor shown in FIG. 7, the recessed portion 20c of the second substrate 20 is provided by the depressed portion 21c of the stack substrate 21, and the part located between the bottom surface of the recessed portion 20c and another surface 20b of the second substrate 20 is only the stack substrate 21.

In the above-described first embodiment, the diaphragm portion 15 may be formed only by the semiconductor layer 13. That is, the insulating film 12 may be removed from the depressed portion 14. Similarly, in the above-described second embodiment, the diaphragm portion 15 may be provided by the semiconductor layer 13 and the thin insulating film 17.

While the disclosure has been described with reference to preferred embodiments thereof, it is to be understood that the disclosure is not limited to the preferred embodiments and constructions. The disclosure is intended to cover various modification and equivalent arrangements. In addition, the various combinations and configurations, which are preferred, other combinations and configurations, including more, less or only a single element, are also within the spirit and scope of the disclosure.

The invention claimed is:

1. A manufacturing method of a semiconductor device, wherein the semiconductor device includes:
a first substrate having one surface; and
a second substrate having one surface joined to the first substrate with the one surface facing the one surface of the first substrate, another surface opposite to the one surface, and a recessed portion arranged on the one surface, wherein an airtight chamber having a vacuum pressure is defined by a space between the first substrate and the recessed portion of the second substrate, the manufacturing method of the semiconductor device comprising:
preparing the first substrate that contains silicon;
preparing the second substrate that contains silicon and has the one surface on which the recessed portion is arranged;
joining the one surface of the first substrate and the one surface of the second substrate together to define the airtight chamber;
performing a heat treatment to emit hydrogen gas from the airtight chamber; and
generating OH groups on the one surface of the first substrate and on the one surface of the second substrate before joining the one surface of the first substrate and the one surface of the second substrate together, the one surface of the second substrate including a wall surface of the recessed portion, wherein
in the joining of the one surface of the first substrate and the one surface of the second substrate together, the OH groups generated on the first substrate and the OH groups generated on the second substrate are bonded together to generate covalent bonds,
in the heat treatment, the first substrate and the second substrate are heated at a temperature rise rate of 1° C./sec until a temperature of a part of the first substrate on which the OH groups are generated increases to 700° C. and a part of the second substrate on which the OH groups are generated increases to 700° C., and the hydrogen gas is generated by the heat treatment, and
in the heat treatment, the hydrogen gas that is generated is emitted from the airtight chamber by setting a diffusion length of the hydrogen gas to be equal to or longer than a shortest distance between a wall surface of the airtight chamber and a wall surface of the semiconductor device which is exposed to the atmosphere, and a heating temperature and a heating time are adjusted in the setting of the diffusion length of the hydrogen gas.

2. The manufacturing method of the semiconductor device according to claim 1, further comprising:
forming a diffusion layer by diffusing an impurity in a vicinity of the one surface of the first substrate before joining the first substrate and the second substrate together; and
forming a thin insulating film to cover the diffusion layer, wherein
the thin insulating film configures the one surface of the first substrate,
in the preparing of the second substrate, the recessed portion is arranged so that the recessed portion faces the diffusion layer when the first substrate and the second substrate are joined together, and
in the heat treatment, the heat treatment is performed with the thin insulating film formed on the first substrate.

* * * * *